United States Patent
Song et al.

(10) Patent No.: US 7,719,323 B2
(45) Date of Patent: May 18, 2010

(54) SIGNAL RECEIVER CIRCUIT CAPABLE OF IMPROVING AREA AND POWER EFFICIENCY IN SEMICONDUCTOR INTEGRATED CIRCUITS

(75) Inventors: Hee-Woong Song, Ichon (KR); Kun-Woo Park, Ichon (KR); Yong-Ju Kim, Ichon (KR); Joon-Woon Kim, Ichon (KR); Ic-Su Oh, Ichon (KR); Hyung-Soo Kim, Ichon (KR); Tae-Jin Hwang, Ichon (KR)

(73) Assignee: Hynix Semiconductor Inc. (KR)

( * ) Notice: Subject to any disclaimer, the term of this patent is extended or adjusted under 35 U.S.C. 154(b) by 9 days.

(21) Appl. No.: 11/959,264

(22) Filed: Dec. 18, 2007

(65) Prior Publication Data

US 2008/0191776 A1    Aug. 14, 2008

(30) Foreign Application Priority Data

Feb. 12, 2007   (KR) ...................... 10-2007-0014242

(51) Int. Cl.
*H03K 5/22* (2006.01)
(52) U.S. Cl. ............................. 327/74; 327/75; 327/76; 341/159
(58) Field of Classification Search .................. 327/74, 327/75, 76; 341/159
See application file for complete search history.

(56) References Cited

U.S. PATENT DOCUMENTS

| | | | | |
|---|---|---|---|---|
| 5,396,131 A | * | 3/1995 | Miki et al. | 327/65 |
| 6,373,423 B1 | * | 4/2002 | Knudsen | 341/159 |
| 6,480,135 B2 | * | 11/2002 | Gendai | 341/159 |
| 6,486,710 B1 | * | 11/2002 | Simoni | 327/63 |
| 6,950,370 B2 | | 9/2005 | Lee | |
| 6,987,704 B2 | | 1/2006 | Park | |
| 7,199,653 B2 | * | 4/2007 | Miyata | 327/564 |
| 7,224,191 B1 | * | 5/2007 | Wang et al. | 327/60 |

FOREIGN PATENT DOCUMENTS

| | | |
|---|---|---|
| JP | 11-328963 | 11/1999 |
| JP | 2000200494 | 7/2000 |
| JP | 07272487 | 12/2007 |
| KR | 1020000056516 A | 9/2000 |
| KR | 1020010091640 | 10/2001 |

\* cited by examiner

*Primary Examiner*—Kenneth B. Wells
(74) *Attorney, Agent, or Firm*—Baker & McKenzie LLP

(57) ABSTRACT

A signal receiver circuit includes a first level detector for offset-controlling a first output node in response to a pair of first reference signals. A second level detector offset-controls a second output node in response to a pair of second reference signals.

6 Claims, 3 Drawing Sheets

US 7,719,323 B2

SIGNAL RECEIVER CIRCUIT CAPABLE OF IMPROVING AREA AND POWER EFFICIENCY IN SEMICONDUCTOR INTEGRATED CIRCUITS

CROSS-REFERENCES TO RELATED APPLICATIONS

The present application claims priority under 35 U.S.C. 119(a) to Korean application number 10-2007-0014242, filed on Feb. 12, 2007, which is incorporated by reference in its entirety as if set forth in full.

BACKGROUND

1. Technical Field

The present invention relates to semiconductor integrated circuits (ICs), and more particularly, to apparatuses and methods for improving the area efficiency and the power efficiency in semiconductor ICs.

2. Related Art

Recently, semiconductor ICs have tended toward high-speed, high-integration and mass-storage. In order to realize such advanced semiconductor ICs, various advanced technologies have been suggested. For instance, a multi-level transmission technology has been extensively used as an information transmission technology. In multi-level transmission apparatus, information having a plurality of bits can be transmitted as a one-bit data signal. The multi-bit transmitted information is decoded from the one bit data signal based on a signal level thereof. That is, unlike prior technology in which a single bit of data can only convey one of two discrete signal levels, i.e., high and low, multi-level transmission technology allows a single bit of data to convey a plurality of signal levels, e.g., 4 signal levels. Accordingly, such multi-level transmission apparatus exhibit improved information transmission speeds.

Conventional signal receiver circuits used for implementing such a multi-level transmission approach include a preamplifier and a regenerative amplifier having resistors that occupy a relatively large space. Consequently, the area efficiency for such apparatuses is reduced. Additionally, since conventional signal receiver circuit has a plurality of electric elements, a large amount of power is required to drive the electric element. Thus, power consumption is increased and the performance of the semiconductor IC is degraded. There presently is no means for solving the problems of conventional signal receiver circuit when implementing multi-level transmission.

SUMMARY

A signal receiver circuit is capable of multi-level transmission and provides an increased area margin and therefore improved power efficiency.

In one aspect, a signal receiver circuit includes: a first level detecting unit configured to offset-control a first output node in response to a pair of first reference signals; and a second level detecting unit configured to offset-control a second output node in response to a pair of second reference signals.

In another aspect, a signal receiver circuit includes: a first node; a second node; an output node; a first input unit configured to control a voltage level of the first node in response to a main input signal; a second input unit configured to control a voltage level of the second node in response to a sub-input signal; a first offset unit configured to control the voltage level of the first node in response to a main reference signal; a second offset unit configured to control the voltage level of the second node in response to a sub-reference signal; and a signal processor configured to amplify and latch a voltage level of the output node corresponding to the voltage levels of the first and second nodes in synchronization with a clock signal.

In still another aspect, a signal receiver circuit is configured to receive an input signal comprising multiple data bits, the signal receiver circuit includes: a plurality of level detecting units configured to receive the input signal and compare the voltage level of the input signal to a corresponding threshold voltage and generate a detection signal with a value based on the comparison, wherein the threshold voltage is generated from a reference voltage and the inverse of the reference voltage; and a decoder coupled with the plurality of level detecting units, the decoder configured to determine a value for the bits of data included in the input signal based on the value of the detection signals.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
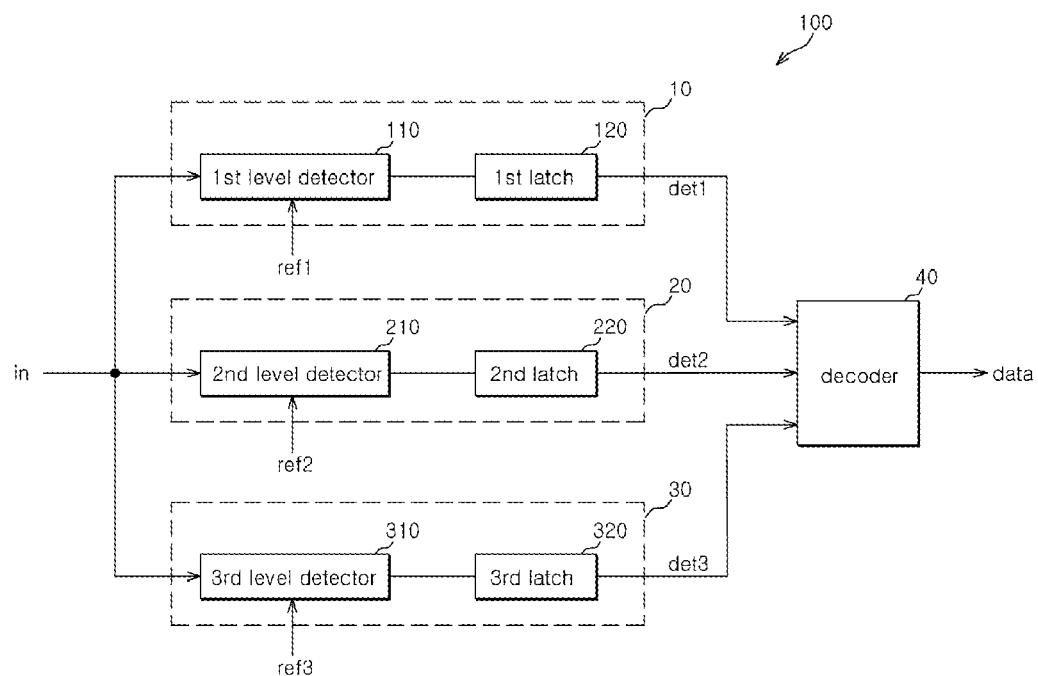
FIG. 1 is a block diagram illustrating an example signal receiver circuit according to one embodiment.

FIG. 1 is a block diagram illustrating an example signal receiver circuit 100 according to an embodiment, in which the signal receiver circuit 100 can receive multiple bits of information from a one-bit input signal, wherein the multiple bits of information correspond to voltage levels of the input signal. It will be understood that the embodiment of FIG. 1 is presented by way of example and is not intended to limit the apparatus and methods described herein to a particular design or architecture, or to a certain number of input voltage levels.

As shown in FIG. 1, the signal receiver circuit 100 receives an input signal (in) and includes a first detector 10, a second detector 20, a third detector 30 and a decoder 40. The first detector 10 can be configured to detect whether the input signal (in) exceeds a first threshold level. When the input signal (in) exceeds the first threshold level, the first detector 10 can enable a first detection signal (det1). The second detector 20 can be configured to detect whether the input signal (in) exceeds a second threshold level, and to enable a second detection signal (det2) when the input signal (in) does exceed the second threshold level. The third detector 30 can be configured to detect whether the input signal (in) exceeds a third threshold level, and to enable a third detection signal (det3) when the input signal (in) does exceed the third threshold level. The decoder 40 receives the first to third detection signals (det1) to (det3) and determines the resulting data values.

The first detector 10 can include a first level detector 110 configured to detect the voltage level of the input signal (in) by amplifying and latching the input signal (in) in response to a clock signal (clk) (see FIG. 3) and a first reference signal (ref1) (see FIG. 3), and a first latch 120 configure to output the first detection signal (det1) by latching the output signal of the first level detector 110.

The second detector 20 can include a second level detector 210 configured to detect the voltage level of the input signal (in) by amplifying and latching the input signal (in) in response to the clock signal (clk) and a second reference signal (ref2) (see FIG. 3), and a second latch 220 configured to output the second detection signal (det2) by latching the output signal of the second level detector 210.

The third detector 30 can include a third level detector 310 configured to detect the level of the input signal (in) by amplifying and latching the input signal (in) in response to the clock signal (clk) and a third reference signal (ref3) (see FIG. 3), and a third latch 320 configured to output the third detection signal (det3) by latching the output signal of the third level detector 310.

Figure 3:
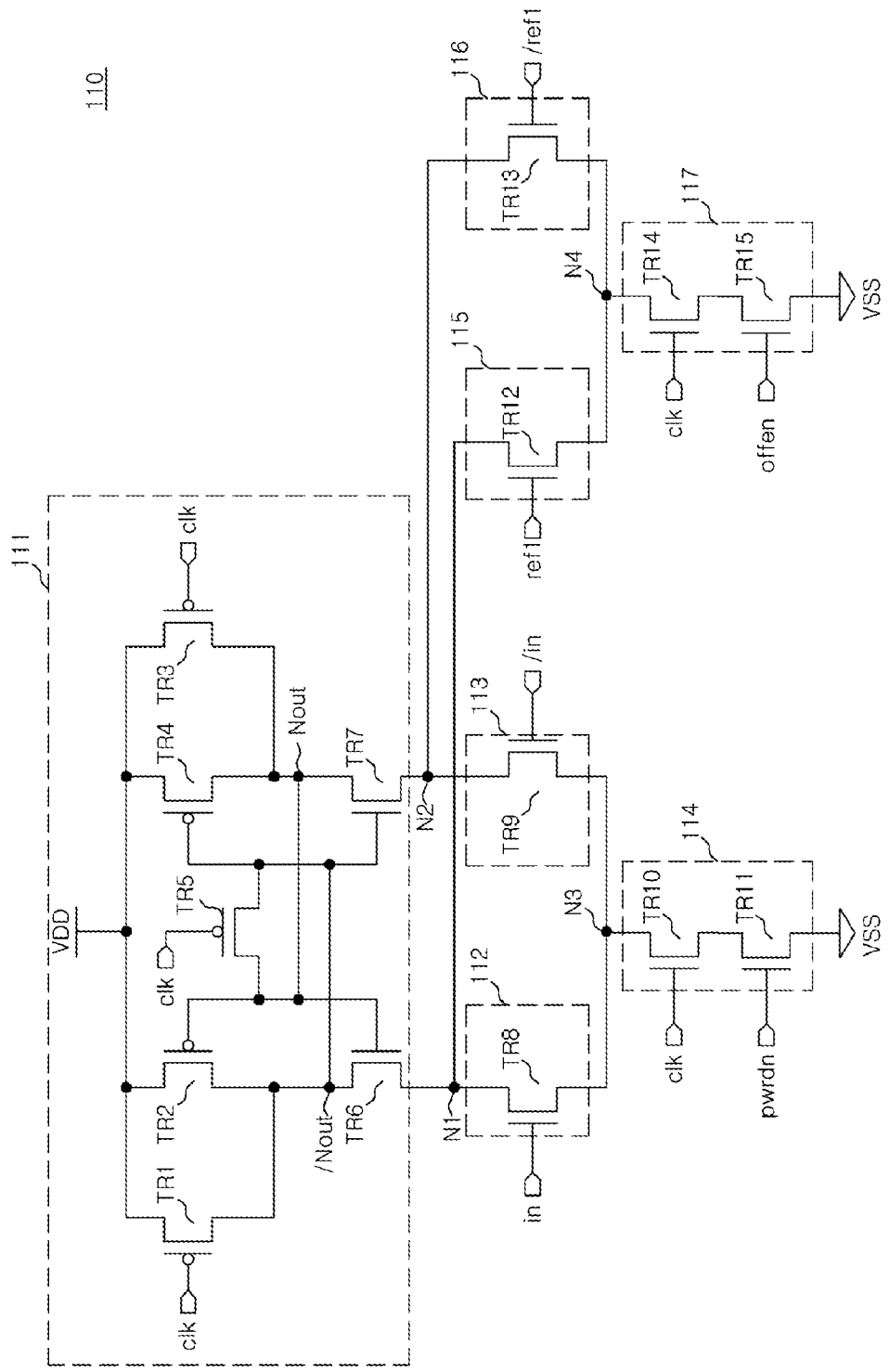
FIG. 3 is a schematic diagram illustrating an example implementation of a first level detector included in the signal receiver circuit shown in FIG. 1.

The first to third reference signals (ref1) to (ref3) are level signals for setting the first to third threshold levels, respectively. As can be seen in FIG. 3, the input signal (in) and each reference signal (ref1), (ref2), and (ref3) can consist of a pair of signals including a main signal and a sub-signal, which is the inverse of the main signal. Similarly, the output signals of the first to third level detectors 110, 210 and 310 can also consist of a pair of signals including a main signal and a sub-signal.

Figure 2:
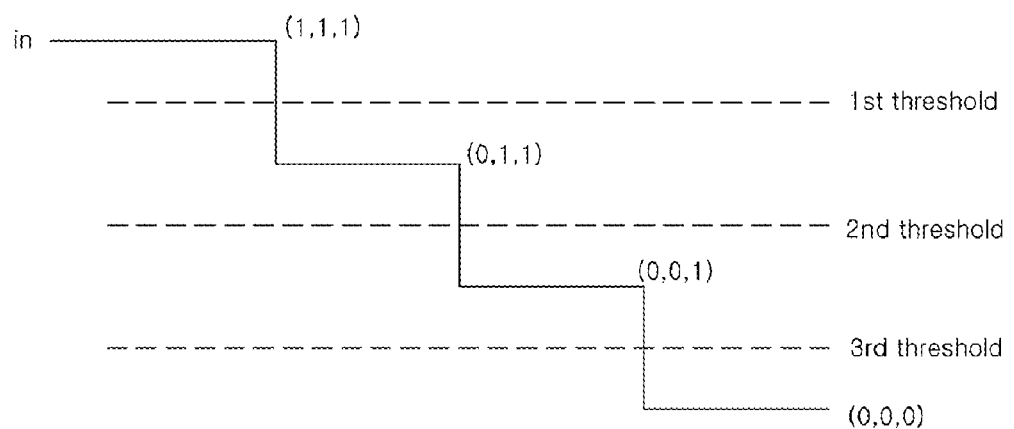
FIG. 2 is a diagram illustrating the operation of the signal receiver circuit shown in FIG. 1.

The operation of the signal receiver circuit 100 can be described in detail with reference to FIG. 2. As can be seen in FIG. 2, the first threshold level associated with first detector 10 can be higher than the second threshold level associated with the second detector 20, which in turn can be higher than the third threshold level associated with the third detector 30. When the level of the input signal (in) exceeds the first threshold level, the first detector 10 can be configured to output the first detection signal (det1) having a high level. Similarly, the second detector 20 can be configured to also output the second detection signal (det2) having a high level, since the voltage level of the input signal (in) will also exceed the second threshold level. The third detector 30 can also be configured to output the third detection signal (det3) having a high level, since the voltage level of the input signal will also exceed the third threshold level.

Thus, the input to decoder 40, i.e., detection signals (det1), (det2), and (det3), can have the value (1,1,1), i.e., a high voltage level on any of detection signals (det1), (det2), and (det3) can be interpreted as a logic "1" by decoder 40. Of course, in other embodiments a high voltage level on any of detection signals (det1), det2), and (det3) can be interpreted as a logic "0" by decoder 40.

Continuing with FIG. 2, when the input signal (in) has a voltage level lower than the first threshold level, but higher than the second threshold level, then first detector 10 can be configured to output the first detection signal (det1) having a low level. The second detector 20 and third detector 30 can, however, be configured to output the second detection signal (det2) and third detection signal (det3), respectively, having a high level, since the voltage level of the input signal (in) exceeds the second and third thresholds. Thus, the input to decoder 40 will be (0,1,1) in such a scenario.

Still continuing with FIG. 2, when the input signal (in) has a voltage level lower than the second threshold level, but higher than the third threshold level, then the first detector 10 and second detector 20 can be configured to output a low level on detection signals (det1) and (det2), respectively; however, the third detector 30 can be configured to output the third detection signal det3 having a high level, since the voltage level of the input signal (in) exceeds the third threshold. At this time, the input to detector 40 will be (0, 0, 1).

Finally, in the example of FIG. 2, when the input signal (in) has a voltage level lower than the third level, then the first detector 10, second detector 20, and third detector 30 can each be configured to generate a low level on detection signals (det1), (det2), and (det3), respectively, since the input signal (in) voltage level is below all three threshold levels. At this time, the input to decoder 40 will be (0, 0, 0).

Thus, three bits of data can be detected from the one-bit input signal (in) in the signal receiver circuit 100. It will also be understood that additional bits of data can be detected from the one-bit input signal (in) by adding additional detectors and defining additional threshold voltages.

FIG. 3 is a schematic diagram illustrating an example implementation of the first level detector 110 shown in FIG. 1. It will be understood that the description of level detector 110 can apply equally to level detectors 210 and 310, although such does not necessarily have to be the case.

As shown in FIG. 3, the first level detector 110 includes a signal processor 111, a first input unit 112, a second input unit 113, a first controller 114, a first offset unit 115, a second offset unit 116 and a second controller 117.

The signal processor 111 can be configured to respond to the clock signal (clk) and to control the voltage levels of a pair of output nodes Nout and /Nout in correspondence with the voltage levels of the first and second nodes N1 and N2. The signal processor 111 can include a first transistor TR1, which can comprise a gate terminal receiving the clock signal (clk), a source terminal coupled with an external power supply signal (VDD), and a drain terminal coupled with the sub-output node /Nout, a second transistor TR2, which can comprise a gate terminal coupled with the main output node Nout, a source terminal coupled with the external power supply signal (VDD), and a drain terminal coupled with the sub-output node /Nout, a third transistor TR3, which can comprise a gate terminal receiving the clock signal (clk), a source terminal coupled with the external power supply signal (VDD), and a drain terminal coupled with the main output node Nout, and a fourth transistor TR4, which can comprise a gate terminal coupled with the sub-output node /Nout, a source terminal coupled with the external power supply signal (VDD), and a drain terminal coupled with the main output node Nout.

In addition, the signal processor 111 can include a fifth transistor TR5, which can comprise a gate terminal receiving the clock signal (clk) and disposed between the main output mode Nout and the sub-output node /Nout, a sixth transistor TR6, which can comprise a gate terminal coupled with the main output node Nout, a drain terminal coupled with the sub-output node /Nout, and a source terminal coupled with a first node N1, and a seventh transistor TR7, which can comprise a gate terminal coupled with the sub-output node /Nout, a drain terminal coupled with the output node Nout, and a source terminal coupled with a first node N2.

The first input unit 112 can be configured to control the voltage level of the first node N1 in response to the main input signal (in). The first input unit 112 can include an eighth transistor TR8, which can comprise a gate terminal receiving the main input signal (in), a drain terminal coupled with the first node N1, and a source terminal coupled with a third node N3.

The second input unit 113 can be configured to control the voltage level of the second node N2 in response to the sub-input signal (/in). The second input unit 113 can include a ninth transistor TR9, which can comprise a gate terminal receiving the sub-input signal (/in), a drain terminal coupled with the second node N2, and a source terminal coupled with the third node N3.

The first controller 114 can be configured to control the first and second input units 111 and 112 in response to the clock signal (clk) and the power down signal (pwrdn). The first controller 114 can include a tenth transistor TR10, which can comprise a gate terminal receiving the clock signal (clk) and a drain terminal coupled with the third node N3, and an eleventh transistor TR11, which can comprise a gate terminal receiving the power down signal (pwrdn), a drain terminal coupled with the source terminal of the tenth transistor TR10 and a source terminal that is grounded.

The first offset unit 115 can be configured to control the voltage level of the first node N1 in response to the first main reference signal (ref1). The first offset unit 115 can include a twelfth transistor TR12, which can comprise a gate terminal receiving the first reference signal (ref1), a drain terminal coupled with the first node N1, and a source terminal coupled with a fourth node N4.

The second offset unit 116 can be configured to control the voltage level of the second node N2 in response to the first sub-reference signal (/ref1). The second offset unit 116 can include a thirteenth transistor TR12, which can comprise a gate terminal receiving the first sub-reference signal (/ref1), a drain terminal coupled with the second node N2, and a source terminal coupled with the fourth node N4.

The second controller 117 can be configured to control the first and second offset units 115 and 116 in response to the clock signal (clk) and the offset enable signal (offen). The second controller 117 can include a fourteenth transistor TR14, which can comprise a gate terminal receiving the clock signal (clk), and a drain terminal coupled with the fourth node N4, and a fifteenth transistor TR15, which can comprise a gate terminal receiving the offset enable signal (offen), a drain terminal coupled with the source terminal of the fourteenth transistor TR14, and a source terminal that is grounded.

The offset enable signal (offen) can be used to enable the signal receiver circuit 100. The power down signal (pwrdn) can be a low enable signal used for stopping the operation of the signal receiver circuit 100 in the power down mode.

It can be understood from the structure of the first level detector 110 that the first level detector 110 acts as a sense amplifier, which is operational only when the clock signal (clk) transitions to a high level. That is, since the first node N1 is maintained in a predetermined level by the first reference signal (ref1), if the level of the input signal (in) is sufficient to lower the voltage level of the first node N1, the voltage levels of the first node N1 and the sub-output node /Nout are lowered. In addition, if the voltage level of the sub-output node /Nout transitions to a low level, then the voltage level of the main output node Nout will transition to a high level.

In contrast, if the level of the input signal (in) is insufficient to lower the voltage level of the first node N1, the voltage level of the sub-input signal (/in) will be sufficient to lower the voltage level of the second node N2. At this time, the voltage level of the main output node Nout will transition to a low level.

Through the above procedure, the first level detector 110 detects whether the voltage level of the input signal (in) exceeds the first threshold level. In addition, similarly to the first level detector 110, the second and third level detectors 210 and 310 can be configured to detect whether the voltage level of the input signal (in) exceeds the second and third threshold levels, respectively.

Moreover, such an implementation of a signal receiver circuit 100 can be implemented with area efficiency as compared with the conventional signal receiver circuit designs. This is because conventional designs employ a preamplifier and a regenerative amplifier, which each require a large, area intensive resistor. The signal receiver circuit described herein does not require such large resistors and can therefore not only be laid out in a more efficient manner, but can also lower power consumption since circuit 100 only operates when the clock signal (clk) is high.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A signal receiver circuit in a semiconductor integrated circuit comprising:
   a first level detecting unit configured to offset-control a first output node in response to a pair of first reference signals and a power down signal; and
   a second level detecting unit configured to offset-control a second output node in response to a pair of second reference signals and the power down signal,
   wherein the first level detecting unit comprises:
       a signal processor configured to respond to a clock and control the voltage level of the first output node corresponding to the voltage levels of the first and second nodes;
       a first input unit configured to control the voltage level of the first node in response to a main input signal of the pair of input signals;
       a second input unit configured to control the voltage level of the second node in response to a sub-input signal of the pair of input signals;
       a controller configured to control the first input unit and the second input unit in response to the clock and the power down signal
       a first offset unit configured to control the voltage level of the first node in response to a main reference signal of the pair of the first reference signals; and
       a second offset unit configured to control the voltage level of the second node in response to a sub-reference signal of the pair of the first reference signals.

2. The signal receiving circuit as claimed in claim 1, wherein the first level detecting unit is configured to control the voltage levels of the first and second nodes in response to the pair of input signals and the pair of first reference signals, and control the voltage level of the first output node corresponding to the voltage levels of the first and second nodes.

3. The signal receiving circuit as claimed in claim 1, wherein the second level detecting unit is configured to control the voltage levels of the first and second nodes in response to a pair of input signals and the pair of second reference signals, and control the voltage level of the second output node corresponding to the voltage levels of the first and second nodes.

4. The signal receiving circuit as claimed in claim 3, wherein the second level detecting unit comprises:
   a signal processor configured to respond to the clock and control the voltage level of the second output node corresponding to the voltage levels of the first and second nodes;

a first input unit configured to control the voltage level of the first node in response to the main input signal of the pair of input signals;

a second input unit configured to control the voltage level of the second node in response to the sub-input signal of the pair of input signals;

a controller configured to control the first input unit and the second input unit in response to the clock and the power down signal;

a first offset unit configured to control the voltage level of the first node in response to a main reference signal of the pair of the second reference signals; and a second offset unit configured to control the voltage level of the second node in response to a sub-reference signal of the pair of the second reference signals.

5. The signal receiving circuit as claimed in claim 1, further comprising:

a first latch configured to output a first detection signal by latching an output signal of the first level detecting unit; and a second latch configured to output a second detection signal by latching an output signal of the second level detecting unit.

6. The signal receiving circuit as claimed in claim 5, further comprising a decoder configured to receive the first and second detection signals to restore data.

* * * * *